United States Patent
Blaffert et al.

(10) Patent No.: US 9,324,167 B2
(45) Date of Patent: Apr. 26, 2016

(54) APPARATUS AND METHOD FOR GENERATING AN ATTENUATION CORRECTION MAP

(75) Inventors: Thomas Blaffert, Hamburg (DE); Steffen Renisch, Hamburg (DE); Bernd Schweizer, Ketsch (DE); Zhiqiang Hu, Twinsburg, OH (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 130 days.

(21) Appl. No.: 14/117,056

(22) PCT Filed: May 22, 2012

(86) PCT No.: PCT/IB2012/052561
§ 371 (c)(1),
(2), (4) Date: Nov. 12, 2013

(87) PCT Pub. No.: WO2012/160511
PCT Pub. Date: Nov. 29, 2012

(65) Prior Publication Data
US 2014/0193054 A1    Jul. 10, 2014

Related U.S. Application Data

(60) Provisional application No. 61/489,308, filed on May 24, 2011.

(51) Int. Cl.
*G06K 9/00* (2006.01)
*G06T 11/00* (2006.01)
(Continued)

(52) U.S. Cl.
CPC .......... *G06T 11/005* (2013.01); *G01R 33/481* (2013.01); *G06T 7/0081* (2013.01);
(Continued)

(58) Field of Classification Search
CPC .. G01R 33/481; G06T 11/005; G06T 7/0081; G06T 7/0091; G06T 7/0097; G06T 2207/10084; G06T 2207/10088; G06T 2207/10104; G06T 2207/20136; G06T 2207/20152; G06T 2207/20221; G06T 2207/30004; G06T 2207/30008; G06T 2207/30; G06T 2207/30061
See application file for complete search history.

(56) References Cited

U.S. PATENT DOCUMENTS

| 6,339,223 B1 * | 1/2002 | Motomura | A61B 6/5235 250/363.04 |
| 7,123,760 B2 * | 10/2006 | Mullick | G06T 5/50 378/21 |

(Continued)

FOREIGN PATENT DOCUMENTS

| CN | 101810480 A | 8/2010 |
| EP | 2161594 A2 | 3/2010 |
| WO | 2012021848 A1 | 2/2012 |

OTHER PUBLICATIONS

Salman N, ("Image Segmentation Based on Watershed and Edge Detection Techniques"; 2006; The Intl. Arab Journal of Information Technology; 3(2)104-110).*

(Continued)

*Primary Examiner* — Amara Abdi

(57) ABSTRACT

The invention relates to an apparatus for generating an attenuation correction map. An image providing unit (5, 6) provides an image of an object comprising different element classes and a segmentation unit (11) applies a segmentation to the image for generating a segmented image comprising image regions corresponding to the element classes. The segmentation is based on at least one of a watershed segmentation and a body contour segmentation based on a contiguous skin and fat layers in the image. A feature determination unit (12) determines features of at least one of a) the image regions and b) boundaries between the image regions depending on image values of the image and an assigning unit (13) assigns attenuation values to the image regions based on the determined features for generating the attenuation correction map. The performed image processing steps can allow for producing a high quality attenuation correction map, even if the initial image does not comprise image values related to the attenuation of radiation like a CT image.

16 Claims, 9 Drawing Sheets

(51) Int. Cl.
    *G01R 33/48*     (2006.01)
    *G06T 7/00*     (2006.01)

(52) U.S. Cl.
    CPC ............. *G06T7/0091* (2013.01); *G06T 7/0097* (2013.01); *G06T 2207/10084* (2013.01); *G06T 2207/10088* (2013.01); *G06T 2207/10104* (2013.01); *G06T 2207/20136* (2013.01); *G06T 2207/20152* (2013.01); *G06T 2207/20221* (2013.01); *G06T 2207/30004* (2013.01); *G06T 2207/30008* (2013.01); *G06T 2207/30061* (2013.01)

(56) References Cited

U.S. PATENT DOCUMENTS

| | | | |
|---|---|---|---|
| 7,327,880 B2 | 2/2008 | Tek | |
| 7,394,933 B2 | 7/2008 | Tek et al. | |
| 2004/0258305 A1 | 12/2004 | Burnham et al. | |
| 2006/0241378 A1 | 10/2006 | Purdy | |
| 2007/0269132 A1* | 11/2007 | Duan | G06T 5/007 382/274 |
| 2008/0247646 A1 | 10/2008 | Chefd'hotel et al. | |
| 2008/0253515 A1* | 10/2008 | Bertram | G01N 23/04 378/62 |
| 2008/0267497 A1 | 10/2008 | Fan | |
| 2009/0123070 A1 | 5/2009 | Xiaoying | |
| 2009/0304242 A1* | 12/2009 | Omi | A61B 6/461 382/128 |
| 2010/0021034 A1 | 1/2010 | Lenglet et al. | |
| 2010/0058722 A1* | 3/2010 | Andersson | B01D 46/0047 55/415 |
| 2010/0081931 A1* | 4/2010 | Destrempes | G06T 7/0083 600/437 |
| 2010/0204563 A1* | 8/2010 | Stodilka | G01R 33/481 600/411 |
| 2010/0284595 A1* | 11/2010 | Mori | G01R 33/56 382/131 |
| 2011/0058722 A1* | 3/2011 | Hu et al. | 382/131 |
| 2011/0150306 A1* | 6/2011 | Ross | A61B 6/032 382/131 |

OTHER PUBLICATIONS

Gauch, J. M.; Image Segmentation and Analysis via Multiscale Gradient Watershed Hierarchies; 1999; IEEE Trans. on Image Processing; 8(1)69-79.
Gonzalez, R., et al.; Digital Image Processing: Section 105 Segmentation by Morphological Watersheds; 2002; Digital Image Processing; pp. 617-626.
Hahn, H. K., et al.; The Skull Stripping Problem in MRI Solved by a Single 3D Watershed Transform; 2004; Medical Image Computing and Computer-Assisted Intervention; pp. 134-143.
Hargreaves, B. A., et al.; Metal-Induced Artifacts in MRI; 2011; Proc. Intl. Soc. Mag. Reson. Med.; 19:4688.
Hofmann, M., et al.; Towards quantitative PET/MRI: a review of MR-based attenuation correction techniques; 2009; Eur. J. Nucl. Med. Mol. Imaging; 36(Suppl 1)S93-S104.
Hu, Z., et al.; MR-based Attenuation Correction for Whole-body PET/MR System; 2010; IEEE Trans. on Nuclear Science; pp. 2119-2122.
Martinez-Moller, A., et al.; Tissue Classification as a Potential Approach for attenuation correction in Whole-Body PET/MRI: Evaluation with PET/CT Data; 2009; J. of Nuclear Medicine; 50(4)520-526.
Riddell, C., et al.; The Watershed Algorithm: A Method to Segment Noisy PET Transmission Images; 1999; IEEE Trans. on Nuclear Science; 46(3)713-719.
Salman, N.; Image Segmentation Based on Watershed and Edge Detection Techniques; 2006; The Intl. Arab Journal of Information Technology; 3(2)104-110.
Stubbs, M., et al.; Potential artefacts from overlying tissues in 31P NMR spectra of subcutaneously implanted rat tumours; 1989; MNR Biomed; 1(4)165-170.
Vincent, L., et al.; Watersheds in Digital Spaces: An Efficient Algorithm Based on Immersion Simulations; 1991; IEEE Trans. on Pattern Analysis and Machine Intelligence; 13(6)583-598.

\* cited by examiner

APPARATUS AND METHOD FOR GENERATING AN ATTENUATION CORRECTION MAP

CROSS REFERENCE TO RELATED APPLICATIONS

This application is a national filing of PCT application Ser. No. PCT/IB2012/052561, filed May 22, 2012, published as WO 2012/160511 A1 on Nov. 29, 2012, which claims the benefit of U.S. provisional application Ser. No. 61/489,308 filed May 24, 2011, which is incorporated herein by reference.

FIELD

The invention relates to an apparatus, a method and a computer program for generating an attenuation correction map for reconstructing an attenuation-corrected nuclear image of an object. The invention relates further to a nuclear imaging apparatus, a nuclear imaging method and a nuclear imaging computer program for generating a nuclear image of an object by using the generated attenuation correction map.

BACKGROUND

The article "Towards quantitative PET/MRI: a review of MR-based attenuation correction techniques" by Matthias Hofmann et al., European Journal of Nuclear Medicine and Molecular Imaging, 36 Suppl 1: pages S93 to S104 (2009) discloses a combined positron emission tomography (PET) and magnetic resonance (MR) imaging system, which produces an attenuation correction map based on an MR image acquired by an MR data acquisition unit. The attenuation correction map is used for reconstructing an attenuation-corrected PET image.

Since the physical origin of an MR image is not related to the attenuation of radiation generated during a PET scan, the quality of the attenuation correction map is reduced in comparison to, for example, an attenuation correction map that is produced based on a computed tomography (CT) image. However, MR images can contrast different tissue types such as water and fat which can be used to improve attenuation correction. Although CT images are known for spatial accuracy from which attenuation correction can be performed, CT images are not known for differentiating different tissue types which can impact attenuation correction. Furthermore, CT images use ionizing radiation to create the images while MR images are created using magnetic resonance.

SUMMARY

One object is to provide an apparatus, a method and a computer program for generating an attenuation correction map for reconstructing an attenuation-corrected nuclear image of an object, wherein the quality of the generated attenuation correction map can be improved. It is a further object to provide a nuclear imaging system, a nuclear imaging method and a nuclear imaging computer program for generating a nuclear image of the object based on the attenuation correction map.

In a first aspect, an apparatus for generating an attenuation correction map for being used for reconstructing an attenuation-corrected nuclear image of an object comprising different element classes is presented, wherein the apparatus comprises:

an image providing unit for providing an image of the object, a watershed segmentation unit for applying a watershed segmentation to the image for generating a segmented image comprising image regions corresponding to the element classes, a feature determination unit for determining features of at least one of a) the image regions and b) boundaries between the image regions depending on image values of the image, an assigning unit for assigning attenuation values to the image regions based on the determined features for generating the attenuation correction map.

When the image is segmented by using a watershed segmentation, features of at least one of a) image regions of the segmented image and b) boundaries between the image regions are determined depending on image values of the segmented image and attenuation values are assigned to the image regions by applying predefined rules to the determined features for generating the attenuation correction map, an attenuation correction map can be produced with improved quality, even if the initial image does not comprise image values related to the attenuation of radiation like a CT image.

The object is preferentially a person or an animal and the element classes define preferentially at least one of bone, in particular, cortical bone and bone marrow, air, tissue, lung, bowel gas, or other, anatomical structures.

The image providing unit can be an imaging system for providing the image like an MR imaging system for providing an MR image. The image providing unit can also include a storing unit, in which the image is stored already and from which the image can be retrieved for providing the image, or a receiving unit for receiving the image via a wired or wireless data connection and for providing the received image. Preferentially, the image providing unit is configured to provide an MR image as the image of the object. An MR image provides anatomical information with a relatively high spatial resolution, thereby allowing the attenuation correction map to be produced with further improved quality.

In an embodiment, instead of or in addition to an MR image also another image can be used for producing the attenuation correction map. For example, a non-attenuation-corrected (NAC) PET image or a time-of-flight (TOF) NAC PET image can be used for producing the attenuation correction map. A TOF-NAC PET image is regarded as being a PET image, which has been reconstructed with considering TOF information and without considering attenuation information. A NAC PET image is regarded as being a PET image, which has been reconstructed without considering TOF information and without considering attenuation information.

In one embodiment, the apparatus further comprises a differentiation unit for differentiating the image for generating a gradient image before applying the watershed segmentation. The watershed segmentation is then preferentially applied to the gradient image. Applying the watershed segmentation to the gradient image further improves the quality of the finally produced attenuation correction map, in particular, if the provided image, for example, the provided MR image, comprises unknown absolute intensity values. The combination of the differentiation for generating the gradient image and of the watershed segmentation is particularly useful for distinguishing between different body structures, if the object is a person or an animal, like soft tissue, bone, lung, or bowel gas.

In another embodiment, the watershed segmentation can also be applied to the provided image, i.e. not to the gradient image.

In an embodiment, the apparatus further comprises a smoothing unit for smoothing the image. The smoothing is preferentially performed, before the watershed segmentation is applied, in particular, before the gradient image is generated. Instead or alternatively, other pre-processing steps can be applied to the provided image like truncation of image values to a certain value range or enhancement of edge structures in the image. Moreover, the smoothing unit can also be adapted to smooth the gradient image.

It is further contemplated that the watershed segmentation unit is configured to generate watershed lines along low image values of the image for generating the segmented image. The segmentation is preferentially performed by generating watershed lines along low image values, if the watershed segmentation is not applied to a gradient image, but to the non-differentiated provided image. This watershed segmentation based on lines along low image values, which are preferentially gray values, improves the quality with which certain element classes are distinguished. For example, if the object is a person or an animal, the differentiation between cortical bone and bone marrow can be improved.

A watershed algorithm regards an image as a topographic relief, where the image values are interpreted as altitude in the relief. Generally a watershed algorithm defines watershed lines along "mountain crests" in the relief, i.e. along high image values. If the watershed segmentation unit is adapted to generate watershed lines along low image values, the corresponding watershed algorithm defines watershed lines along valleys in the relief. These watershed lines along low image values can be calculated by modifying a standard watershed algorithm accordingly or by applying a standard watershed algorithm to an inverted image having inverted image values.

In one embodiment, the feature determination unit is configured to determine at least one of i) region features of the image regions being features, which depend on all image values of the respective image region, and ii) boundary features related to boundaries between the image regions, wherein the boundary features depend on at least one of a) region features of neighboring image regions which are separated by a respective boundary and b) image values on the respective boundary. In particular, the feature determination unit is configured to determine at least one of the following features: an average of the image values of an image region, a minimal image value of an image region, a maximal image value of an image region, a standard deviation of the image values within an image region, an average of the image values on a boundary, a minimal image value of the image values on a boundary, a maximal image value of the image values on a boundary, a standard deviation of the image values on a boundary, a difference of averages of the image values of neighboring image regions which are separated by a respective boundary, a difference between standard deviations of neighboring image regions which are separated by a respective boundary.

In another embodiment, the feature determination unit can be configured to determine for a first image region a boundary feature depending on image values of the first image region and depending on image values of a neighboring second image region. The feature determination unit can be configured to determine a difference of average image values of the first image region and the second image region as a boundary feature. For example, if an attenuation value has not been assigned already to a certain image region, but has been assigned to the neighboring image regions, to the certain image region the attenuation value can be assigned, which has also been assigned to the neighboring image region, for which the smallest difference has been determined. This allows assigning an attenuation value to an image region based on boundary features, which depend on image values of neighboring image regions, even if by using other features an attenuation value can not be assigned to a certain image region.

The assigning unit is preferentially adapted to assign attenuation values to the image regions by applying predefined rules to the determined features for generating the attenuation correction map. In particular, the assigning unit is adapted to assign the attenuation values to the image regions by i) applying the predefined rules to the determined features for assigning the element classes to the image regions for producing a first element class image, and ii) assigning the attenuation values to the determined element classes based on predefined assignments between the element classes and the attenuation values. However, the predefined rules can also directly assign an attenuation value to an image region, without explicitly determining the respective element class.

In one embodiment, the first image providing unit is configured to provide a first image generated by using a first imaging configuration, wherein the assigning unit is configured to:
apply predefined rules to the determined features for assigning the element classes to the image regions for producing a first element class image,
provide a second element class image of the object, which is produced based on a second image of the object generated by using a second imaging configuration and which is segmented into the element classes,
combine the first element class image and the second element class image for producing a combined element class image,
assign the attenuation values to the element classes of the combined element class image based on predefined assignments between the element classes and the attenuation values.

Different imaging configurations can relate to different imaging modalities, i.e. the first image can be generated by using a first imaging modality and the second image can be generated by using a second imaging modality, or they can relate to the same imaging modality, which has been used with different acquisition parameters and/or reconstruction parameters for generating first and second images.

The second image is in one embodiment a NAC nuclear image, in particular, a NAC PET image or a TOF NAC PET image. The combination of the first element class image and the second element class image is in one embodiment performed such that the combined element class image comprises the first element class image and parts of the second element class image, which represents parts of the object, which are not represented by the first element class image. For example, if the first element class image has been generated based on an MR image, which does not show an entire person or animal, also the first element class image does not cover the entire person or animal. The parts not covered by the first element class image are then preferentially covered by the second element class image, wherein the corresponding parts of the second element class image are preferentially used for producing the combined element class image by combining these parts which the entire first element class image.

In one embodiment, the first image providing unit is configured to provide a first image generated by using a first imaging configuration, wherein the assigning unit is further configured to: i) provide an attenuation element class map, which is produced based on a second image generated by using a second imaging configuration and which comprises attenuation values corresponding to the respective element classes at the positions of the respective element classes within the map, and ii) adapt the attenuation correction map by combining the attenuation correction map with the attenuation element class map. The combination of the attenuation correction map with the attenuation element class map is preferentially performed such that the adapted attenuation correction map comprises the originally generated attenuation correction map, i.e. the attenuation correction map before performing the adaptation, and the parts of the attenuation element class map, which cover parts of the object, which are not covered by the original attenuation correction map. This allows generating an attenuation correction map covering a larger part of the object, in particular, the entire object, even if the provided image, in particular, the MR image, does not cover such a large part of the object, in particular, does not cover the entire object.

In one embodiment, the apparatus comprises a nuclear image reconstruction unit for reconstructing a nuclear image based on nuclear data acquired by a nuclear acquisition unit and the attenuation correction map.

In a further aspect, a nuclear imaging system for generating a nuclear image of an object is presented. The nuclear imaging system comprises:
   a nuclear data acquisition unit for acquiring nuclear data, and
   the apparatus for generating an attenuation correction map as defined by one of the above described methods,
   a nuclear image reconstruction unit for reconstructing a nuclear image based on the nuclear data and the attenuation correction map.

The image providing unit of the apparatus for generating an attenuation correction map is preferentially an MR imaging system, i.e. the nuclear imaging system preferentially also comprises an MR imaging capability. The nuclear imaging system could therefore also be regarded as being a combined nuclear/magnetic-resonance imaging system, for example, a combined PET/MR imaging system.

In a further aspect, a method for generating an attenuation correction map for reconstructing an attenuation-corrected nuclear image of an object comprising different element classes is presented. The method comprises:
   providing an image of the object by an image providing unit,
   applying a watershed segmentation to the image for generating a segmented image comprising image regions corresponding to the element classes by a watershed segmentation unit,
   determining features of at least one of a) the image regions and b) boundaries between the image regions depending on image values of the image by a feature determination unit,
   assigning attenuation values to the image regions based on the determined features for generating the attenuation correction map by an assigning unit In a further aspect, a nuclear imaging method for generating a nuclear image of an object is presented. The nuclear imaging method comprises:
   acquiring nuclear data by a nuclear data acquisition unit,
   generating an attenuation correction map with one of the described methods,
   reconstructing a nuclear image based on the nuclear data and the attenuation correction map by a nuclear image reconstruction unit.

In a further aspect, a computer program for generating an attenuation correction map for being used for reconstructing an attenuation-corrected nuclear image of an object comprising different element classes is presented, the computer program comprising program code means for causing an apparatus to carry out the steps of the above described method, when the computer program is run on a computer controlling the apparatus.

In a further aspect, a non-transitory computer readable storage medium carries the above described computer program.

In a further aspect, a nuclear imaging computer program for generating a nuclear image of an object is presented. The computer program comprises program code means for causing a nuclear imaging system to carry out the steps of the nuclear imaging above described method, when the computer program is run on a computer controlling the nuclear imaging system.

These and other aspects of the invention will be apparent from and elucidated with reference to the embodiments described hereinafter.

DETAILED DESCRIPTION OF EMBODIMENTS

Figure 1:
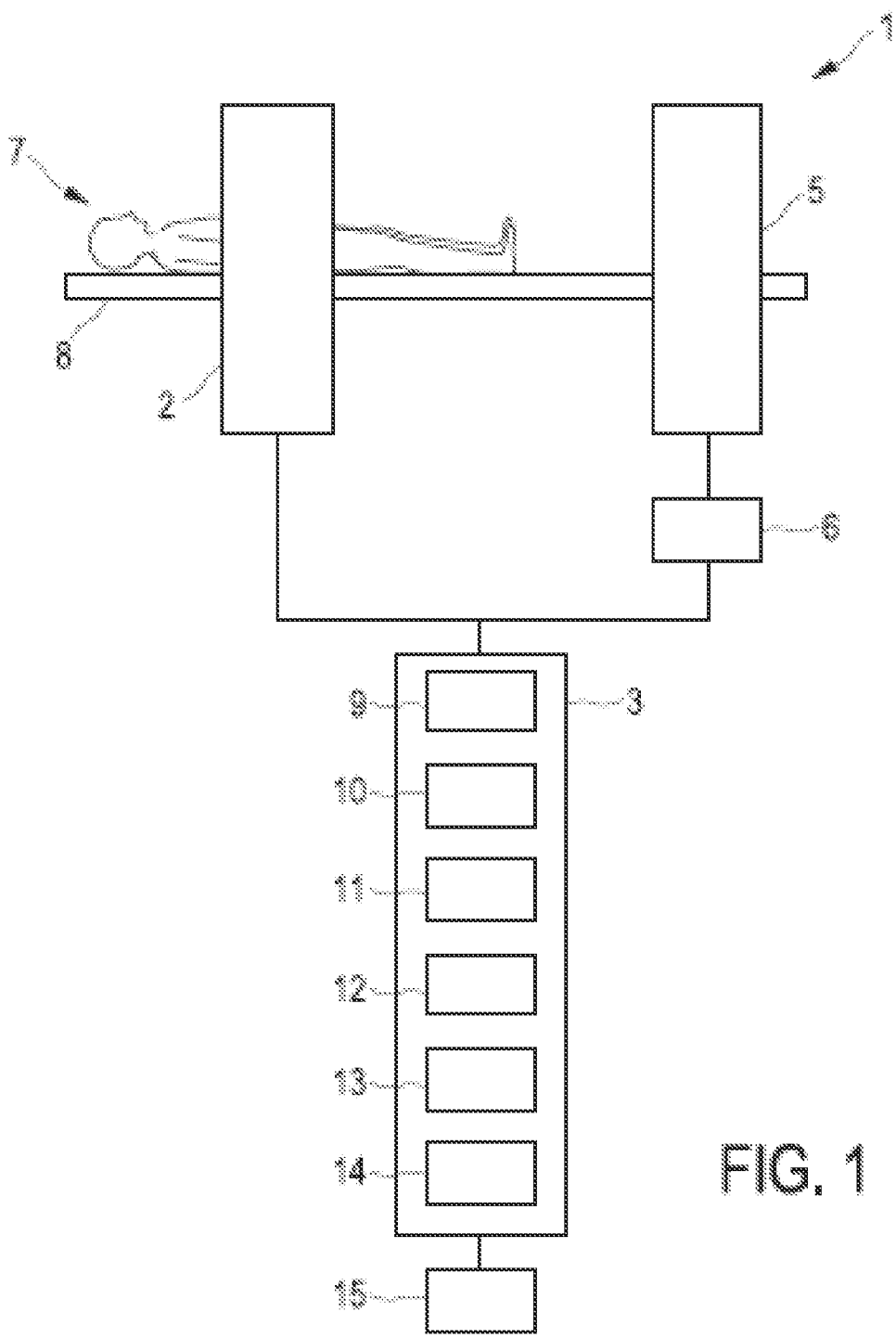
FIG. 1 shows schematically and exemplarily an embodiment of a nuclear imaging system for generating a nuclear image of an object.

FIG. 1 shows schematically and exemplarily a nuclear imaging system 1 for generating a nuclear image of an object 7 comprising different element classes. In this embodiment, the object 7 is a person lying on a table 8, and the different element classes are, for example, air and different tissue types like bone, lung, et cetera. The element classes can also include different bone classes, in particular, a cortical bone class and a bone marrow class. The nuclear imaging system 1 comprises a nuclear data acquisition unit 2 for acquiring nuclear data. In this embodiment, the nuclear data acquisition unit 2 is adapted for acquiring PET data. However, in another embodiment the nuclear data acquisition unit can also be adapted to acquire other nuclear data like single photon emission computed tomography (SPECT) data.

The nuclear imaging system 1 further comprises an MR data acquisition unit 5 for acquiring MR data and an MR reconstruction unit 6 for reconstructing one or more MR images from the acquired MR data. The MR acquisition unit 5 and the MR reconstruction unit 6 form an image providing unit for providing an MR image of the person 7. In other embodiments, the image providing unit can be adapted to provide another image of the object generated by another imaging modality. The image providing unit can also be a storing unit, in which the image is stored already and from which the stored image can be retrieved for providing the image. The image providing unit can also be a receiving unit for receiving an image from, for example, an imaging system like an ultrasound imaging system, a computed tomography imaging system, a MR imaging system, et cetera and for providing the received image. The MR image can be generated using sequences which contrast skin layers and subcutaneous fat such as Dixon sequences.

Figure 2:
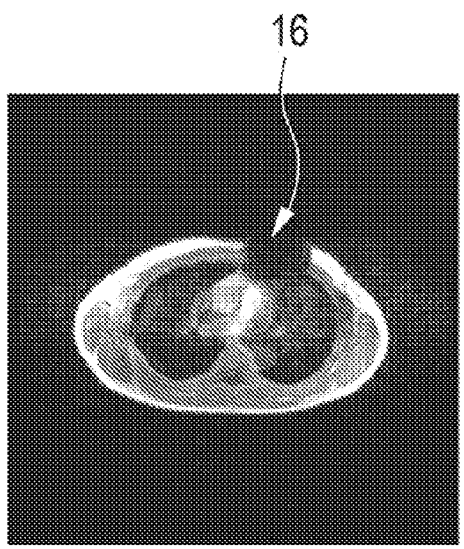
FIG. 2 shows exemplarily an MR image.

FIG. 2 shows exemplarily an MR image of the person 7, in particular, the thorax of the person. The MR image shows an opening 16 being an image artifact caused by a metal element in the imaging region of the MR data acquisition unit 5.

Figure 3:
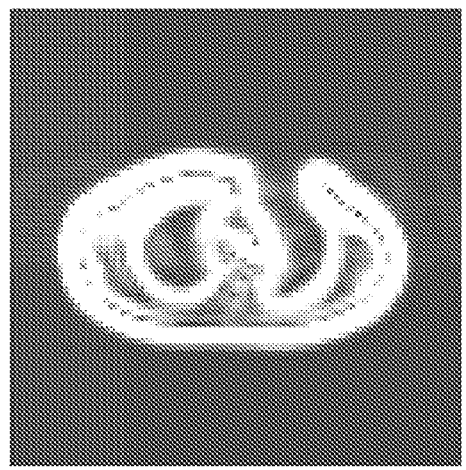
FIG. 3 shows exemplarily a gradient image produced by differentiating the MR image shown in FIG. 2.
Figure 4:
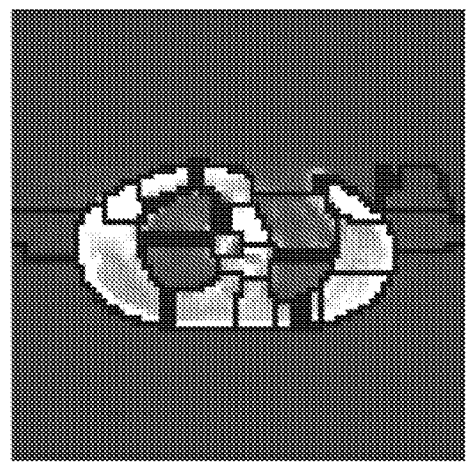
FIG. 4 shows exemplarily the result of a watershed segmentation applied to the gradient image shown in FIG. 3.

The nuclear imaging system further comprises a processing device 3 for processing the PET data and the MR image. The processing device 3 comprises a smoothing unit 9 for smoothing the image. In another embodiment, alternatively or in addition, other pre-processing steps can be performed for pre-processing the image. The processing device 3 further comprises a differentiation unit 10 for differentiating the image and calculating the absolute value of the differentiation for generating a gradient image, which is exemplarily shown in FIG. 3, and a watershed segmentation unit 11 for applying a watershed segmentation to the gradient image for generating a segmented image comprising image regions corresponding to the element classes, in this embodiment corresponding to air and several tissue types. The resulting segmented image with the watershed lines is exemplarily shown in FIG. 4. The smoothing unit 9 can be adapted to also smooth the gradient image before applying the watershed segmentation to the gradient image.

The processing device 3 further comprises a feature determination unit 12 for determining features of the image regions depending on image values of the image. In this embodiment, the feature determination unit 12 is adapted determine at least one of i) region features of the image regions being features, which depend on all image values of the respective image region, and ii) boundary features related to boundaries between the image regions, wherein the boundary features depend on at least one of a) region features of neighboring image regions which are separated by a respective boundary and b) image values on the respective boundary. In particular, the feature determination unit 12 is adapted to determine at least one of the following features: an average of the image values of an image region, a minimal image value of an image region, a maximal image value of an image region, a standard deviation of the image values within an image region, an average of the image values on a boundary, a minimal image value of the image values on a boundary, a maximal image value of the image values on a boundary, a standard deviation of the image values on a boundary, a difference of averages of the image values of neighboring image regions which are separated by a respective boundary, a difference between standard deviations of neighboring image regions which are separated by a respective boundary.

Figure 5:
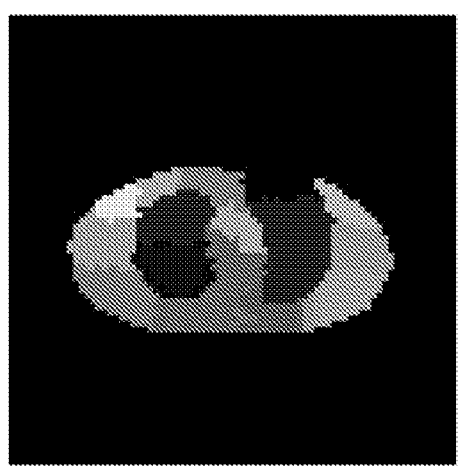
FIG. 5 shows exemplarily an average image value feature image.
Figure 6:
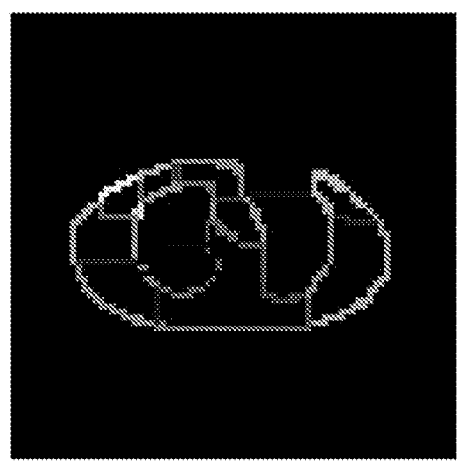
FIG. 6 shows exemplarily an image value difference feature image.

FIG. 5 shows exemplarily an average image values feature image, wherein image regions having different average image values, in particular, different average gray values, are shown with different gray values, and FIG. 6 shows exemplarily an image difference feature image, wherein different differences between averages of image values of neighboring image regions are shown with different gray values.

Figure 7:
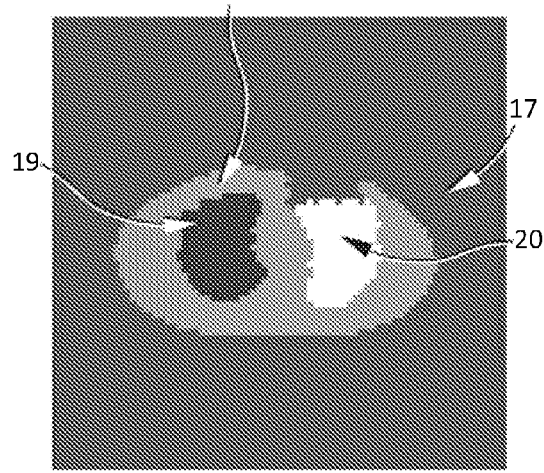
FIG. 7 shows exemplarily different element classes of the object shown in FIG. 2.

The processing device 3 further comprises an assigning unit 13 for assigning attenuation values to the image regions by applying predefined rules to the determined features of the image regions and boundaries for generating the attenuation correction map. In this embodiment, the assigning unit 13 is adapted to apply the predefined rules to the determined features of the image regions and boundaries for assigning the element classes to the image regions for producing a first element class image and to assign the attenuation values to the assigned element classes based on predefined assignments between the element classes and the attenuation values. The rules can be predefined by calibration, wherein features of an image are determined, of which the respective element class distribution is known, and wherein the rules are predefined such that they lead to the known element class distribution, if they are applied to the determined features. A resulting first element class image is exemplarily shown in FIG. 7, in which different element classes have different gray values. In FIG. 7, the element class "air" is denoted by reference number 17, the element class "tissue" is denoted by reference number 18, the element class "right lung" is denoted by reference number 19 and the element class "left lung" is denoted by reference number 20.

The rules can be predefined such that an image region is assigned to the element class "air", if the average image value feature is below a certain threshold and the image region is attached to the image boundary; an image region is assigned to the element class "tissue", if the average image value feature of the image region is above a certain threshold; an image region is assigned to the element class "lung", if the average image value feature is below a certain threshold and the image region is completely surrounded by image regions, which have been assigned to the element class "tissue", and if the standard deviation of image values within the image region divided by the average of the image values within the image region is above a certain threshold. Moreover, the rules can further be predefined such that the element class "lung" is assigned to an image region, if the average image value feature is below a certain threshold and the boundary to neighboring image regions, which have already been assigned to the element class "tissue", is more than x times larger than the boundary to neighboring image regions, which have already been assigned to the element class "air". The variable x can be predefined and can be, for example, three. The rules can further be predefined such that an image region is assigned to the element class "bowel gas", if the average image value feature is below a certain threshold and the standard deviation of image values within the image region divided by the average of the image values within the image region is below a certain threshold. The thresholds can be defined by calibration as described above.

The assigning unit 13 is preferentially further adapted i) to provide a second element class image of the object, which is produced based on a second image of the object generated by a second imaging system and which is segmented into the element classes, ii) to combine the first element class image and the second element class image for producing a combined element class image, and iii) to assign the attenuation values to the element classes of the combined element class image based on predefined assignments between the element classes and the attenuation values. In this embodiment, the provided second element class image is an image, in which different element classes, in particular, soft tissue, air, bone, lung, et cetera, have been labeled and which is based on a NAC PET image or a TOF NAC PET image. The NAC PET image or the TOF-NAC PET image is preferentially generated based on nuclear data acquired by the nuclear data acquisition unit 2. The combination is preferentially performed such that the combined element class image comprises the first element class image and parts of the second element class image, which cover parts of the person 7, which are not covered by the first element class image. In this manner, the second element class, e.g. the NAC PET image, can be used to identify and close the artifact induced in opening 16.

The processing device 3 further comprises a nuclear image reconstruction unit 14 for reconstructing a nuclear image based on the nuclear data acquired by the nuclear data acquisition unit 2 and the generated attenuation correction map. In this embodiment, the nuclear image reconstruction unit 14 is adapted to reconstruct a PET image based on PET data acquired by the nuclear data acquisition unit 2 and the attenuation correction map. The reconstructed nuclear image is shown on a display 15. The processing device 3 together with the image providing unit 5, 6 can be regarded as an apparatus for generating an attenuation correction map for being used for reconstructing an attenuation-corrected nuclear image of the person 7 comprising different element classes.

Figure 8:
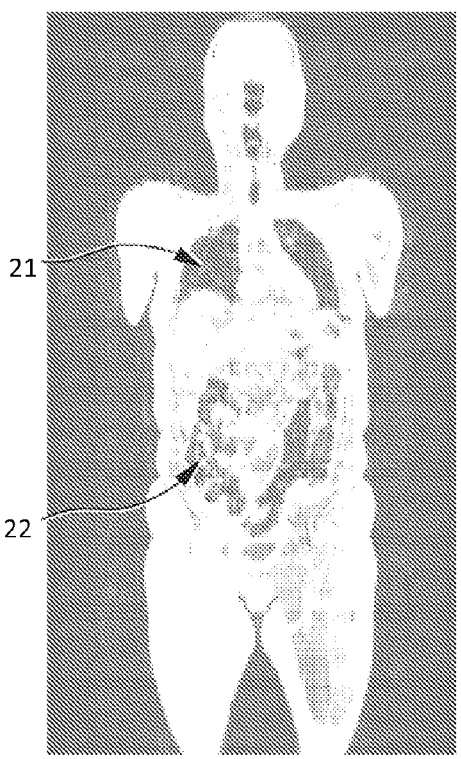
FIG. 8 shows exemplarily a further MR image.

FIG. 8 shows exemplarily a further MR image, which can be provided by the image providing unit 5, 6, i.e. which can be reconstructed by the MR reconstruction unit 6 based on MR data generated by the MR data acquisition unit 5. The MR image shown in FIG. 8 is a coronal view and includes particularly the lung 21 and bowel gas 22.

Figure 9:
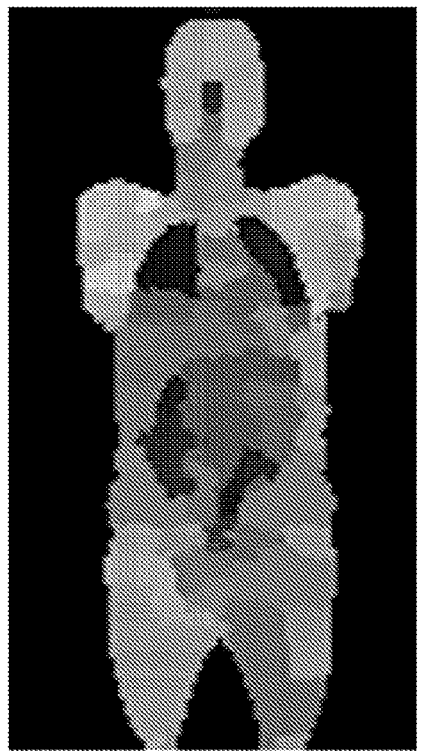
FIG. 9 shows exemplarily an average image value feature image, which corresponds to the MR image shown in FIG. 8.
Figure 10:
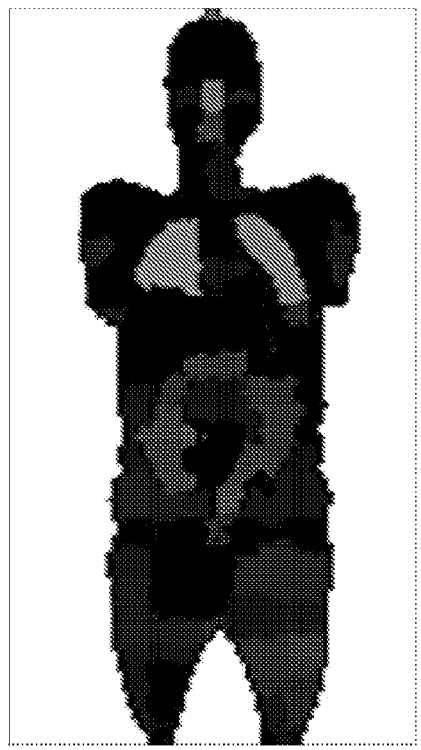
FIG. 10 shows exemplarily a relative error feature image, which corresponds to the MR image shown in FIG. 8.

The MR image shown in FIG. 8 is smoothed by the smoothing unit 9, differentiated by the differentiation unit 10 for generating a gradient image and segmented by the watershed segmentation unit 11 for generating a segmented image comprising image regions corresponding to the element classes of the person shown in the image. The feature determination unit 12 determines then features depending on image values of the MR image as described above. In this example, the feature determination unit 12 determines the average image value, i.e. the average gray value, being the average of the image values of the respective image region. A resulting average image value feature image is exemplarily shown in FIG. 9. The feature determination unit 12 preferentially also determines the standard deviation of image values within a respective image region divided by the average of the image values within the image region. This feature can be regarded as a "relative error feature". FIG. 10 shows schematically exemplarily a corresponding relative error feature image, wherein different relative errors are shown with different gray values in FIG. 10. The assigning unit 13 finally assigns attenuation values to the image regions by applying predefined rules to the determined features for generating the attenuation correction map. The assignment of the attenuation values is preferentially performed in several steps, wherein firstly the predefined rules are applied to the determined features for assigning the element classes to the image regions for producing a first element class image and wherein the attenuation values are assigned to the assigned element classes based on predefined assignments between the element classes and the attenuation values. The assignment of the attenuation values can be performed based on the first element class image or based on a combined element class image, which comprises the first element class image and parts of or a second element class image, which covers parts of the person 7, which are not covered by the first element class image. A first element class image is exemplarily shown in FIG. 11.

Figure 11:
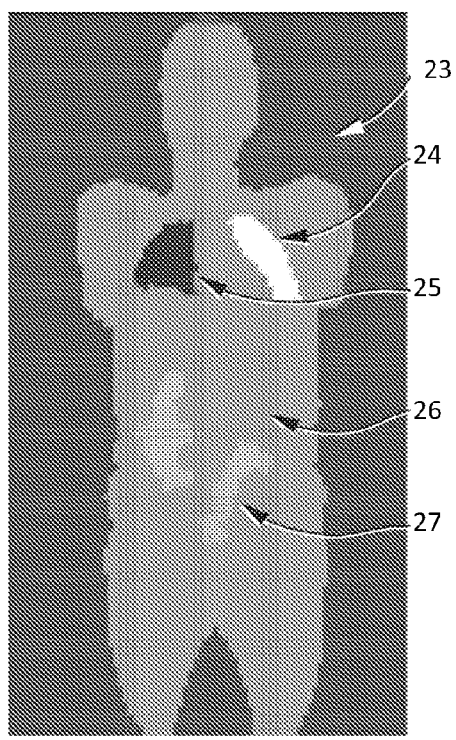
FIG. 11 shows exemplarily different element classes of the object shown in FIG. 8.

In FIG. 11, different element classes are displayed differently. The element class "air" is denoted by reference number 23, the element class "left lung" is denoted by reference number 24, the element class "right lung" is denoted by reference number 25, the element class "tissue" is denoted by reference number 26, and the element class "bowel gas" is denoted by reference number 27. As can be seen in FIG. 11, the left and right lungs 24, 25 can be clearly distinguished from bowel gas 27, although their image values are similar, by a rule that uses the different values of the "relative error feature".

The watershed segmentation unit 11 is preferentially adapted to perform a standard watershed segmentation as disclosed in, for example, the article "Watersheds in Digital Spaces: An Efficient Algorithm Based on Immersion Simulations" by L. Vincent and P. Soille, IEEE Trans. Pattern Anal. Machine Intell., 13(6), 583-598 (1991), which is herewith incorporated by reference. However, in another embodiment the watershed segmentation unit 11 can also be adapted to generate watershed lines along low image values of the respective provided image for generating the segmented image.

A watershed algorithm regards an image as a topographic relief, where the image values are interpreted as altitude in the relief. Generally a watershed algorithm defines watershed lines along "mountain crests" in the relief, i.e. along high image values. If the watershed segmentation unit is adapted to generate watershed lines along low image values, the corresponding watershed algorithm defines watershed lines along valleys in the relief. These watershed lines along low image values can be calculated by modifying a standard watershed algorithm accordingly or by applying a standard watershed algorithm to an inverted image having inverted image values.

Figure 12:
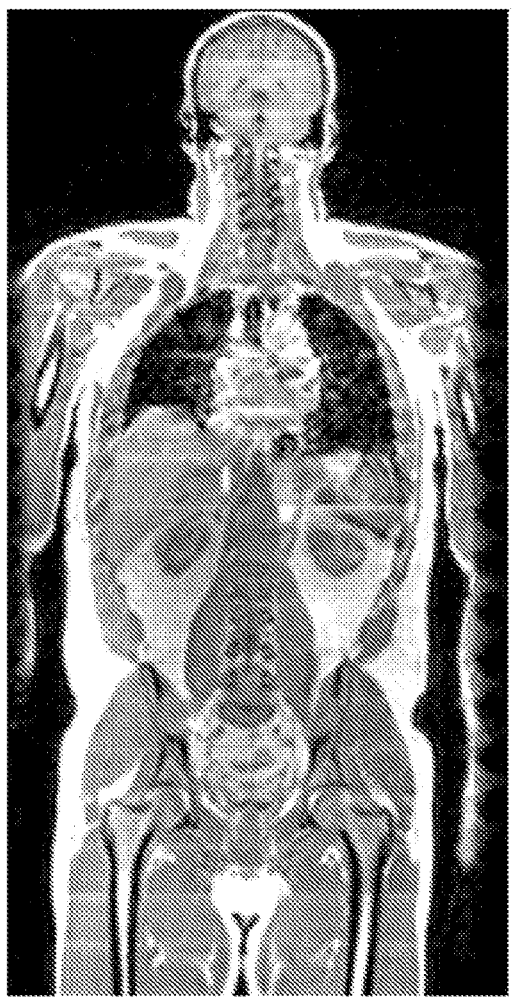
FIG. 12 shows exemplarily a further MR image.
Figure 13:
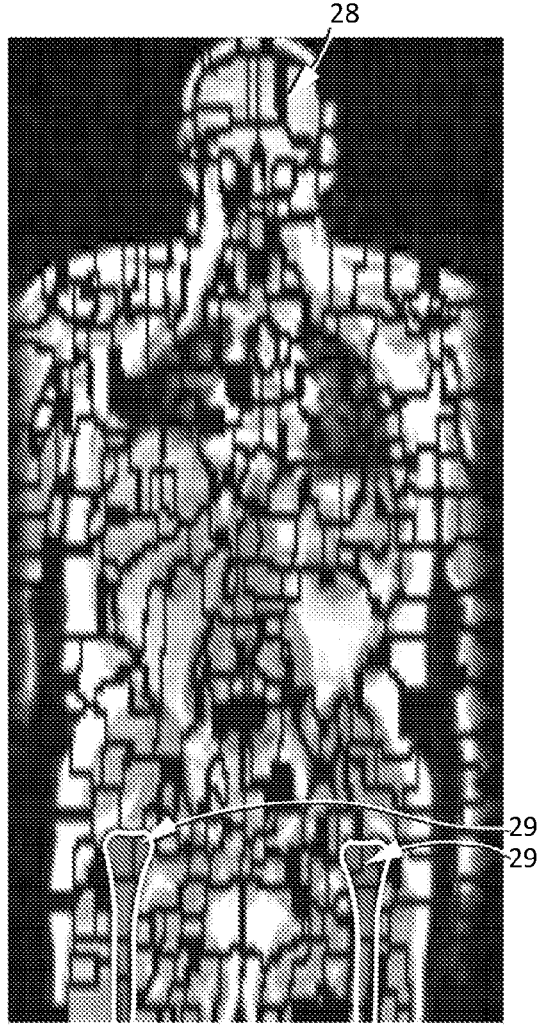
FIG. 13 shows exemplarily the result of a watershed segmentation applied to the MR image shown in FIG. 12 and a segmented femur.

FIG. 12 shows exemplarily a further MR image being an MR slice cutting through the femur of the person 7. In this example, the watershed segmentation unit 11 generates watershed lines along low image values of the MR image shown in FIG. 12 for generating a segmented image. The resulting watershed lines 28 are schematically and exemplarily shown in FIG. 13. Also in this embodiment, the feature determination unit 12 determines features depending on image values of the image, and the assigning unit 13 assigns attenuation values to the image regions by applying predefined rules to the determined features for generating an attenuation correction map, wherein firstly the predefined rules are applied to the determined features for assigning the element classes to the image regions for producing a first element class image and wherein then the attenuation values are assigned to the determined element classes based on predefined assignments between the element classes and the attenuation values. In this embodiment, only the element class "femur" has been assigned to the corresponding image regions depending on the predefined rules. In FIG. 13, the element class "femur" is denoted by reference number 29.

Figure 14:
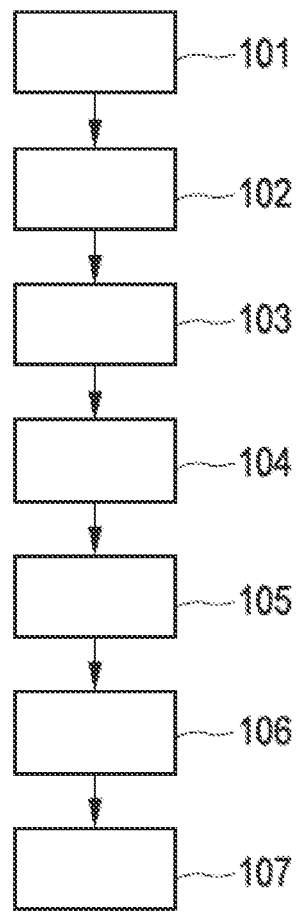
FIG. 14 shows a flowchart exemplarily illustrating an embodiment of a method for generating an attenuation correction map.

In the following a method for generating an attenuation correction map for being used for reconstructing an attenuation-corrected nuclear image of an object will exemplarily be described with reference to a flowchart shown in FIG. 14.

In step 101, the image providing unit 5, 6 provides an image of the person 7. In this embodiment, MR data are acquired by the MR data acquisition unit 5 and an MR image is reconstructed by the MR image reconstruction unit 6.

In step 102, the smoothing unit 9 smoothes the MR image and, in step 103, the differentiation unit 10 differentiates the smoothed MR image, calculates the absolute value of the resulting gradient and optionally smoothes the absolute value for generating a gradient image. In step 104, the watershed segmentation unit 11 applies a watershed segmentation to the gradient image for generating a segmented image comprising image regions corresponding to element classes of the person 7, in particular, corresponding to, for example, soft tissue, bone, right lung, left lung, bowel gas, et cetera.

In step 105, the feature determination unit 12 determines features of at least one of a) the image regions and b) boundaries between the image regions depending on image values of the segmented image and, in step 106, the assigning unit 13 assigns attenuation values to the image regions by applying predefined rules to the determined features for generating the attenuation correction map. In this embodiment, the predefined rules are applied to the determined features for assigning the element classes to the image regions for producing a first element class image, wherein the attenuation values are assigned to the element classes based on predefined assignments between the element classes and the attenuation values. In particular, the assigning unit 13 combines the first element class image with a second element class image, which has been produced based on a second image of the person generated by a second imaging system, for producing a combined element class image, wherein the attenuation values are assigned to the element classes of the combined element class image based on predefined assignments between the element classes and the attenuation values. The second element class image is preferentially based on, for example, a NAC PET image or TOF NAC PET image. However, a second element class image can also be based on another image. In step 107, a PET image is reconstructed based on PET data acquired by the nuclear data acquisition unit 2 and the generated attenuation correction map.

In another embodiment, step 103 can be omitted and the watershed segmentation can be performed to generate watershed lines along low image values by applying the watershed algorithm to the non-differentiated image.

Figure 15:
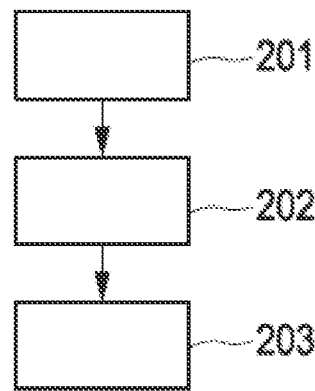
FIG. 15 shows a flowchart exemplarily illustrating an embodiment of a nuclear imaging method for generating a nuclear image of an object.

FIG. 15 shows a flowchart exemplarily illustrating an embodiment of a nuclear imaging method for generating a nuclear image of an object.

In step 201, nuclear data are acquired by the nuclear data acquisition unit 2 and, in step 202, an attenuation correction map is generated based on an MR image provided by the image providing unit 5, 6. The generation of the attenuation correction map is preferentially performed in accordance with steps 102 to 106 described above with reference to FIG. 14. In step 203, the nuclear image reconstruction unit 14 reconstructs a nuclear image, in particular, a PET image, based on the nuclear data and the attenuation correction map.

Figure 31:
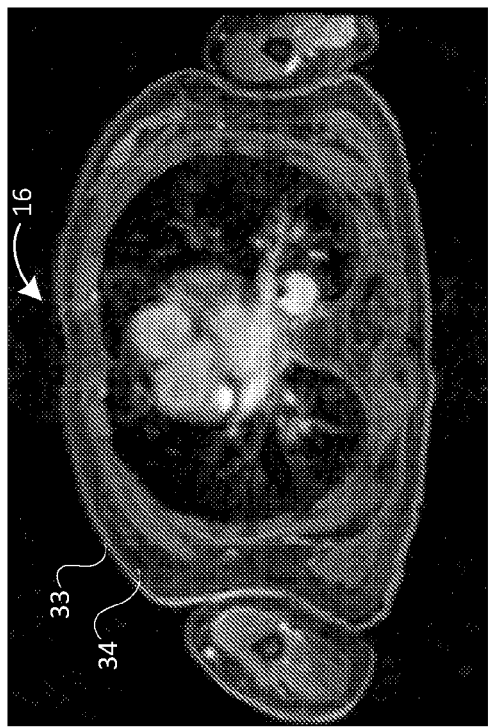
FIG. 31 shows a MR image which contrasts skin layers and subcutaneous fat.

The apparatus and method for generating an attenuation correction map provide preferentially a general image segmentation procedure for MR images, which can be used in a case, where the segmentation task is to separate image regions that contain anatomical structures with relevant attenuation values in order to improve image quality in PET reconstruction. The segmentation task is, for example, to find the body contour and to separate structures within the body such as lung, bowel gas, or bone regions from remaining tissue in order to be able to assign suitable attenuation values for each image region. One or more MR images can be reconstructed by the MR image reconstruction unit 6 such as water and fat images based on MR data from a Dixon sequence. FIG. 31 shows such an image which contrasts the skin layers and subcutaneous fat.

Figure 32:
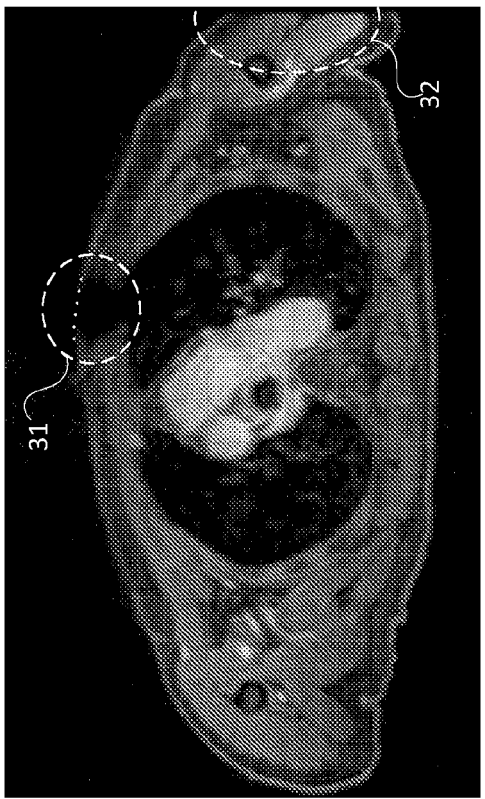
FIG. 32 shows a MR image with truncatation.

A straight-forward image segmentation approach such as the application of an intensity threshold is difficult to implement, because MR images do not show known absolute intensity values like CT images and thus the threshold needs to be determined for each image individually, for example, by assumptions over the noise level. FIG. 2 shows a specific problem where the slice includes the lung areas and also dark tissue areas induced by metal ports. The feature unit can detect truncation in the body contour such as due to a metal element as shown in FIG. 2, or image truncation due to a limited field of view. FIG. 32 shows truncation in the body contour due to a metal element 31 and due to image truncation in the field of view 32. The circled areas show the truncation.

Figure 34:
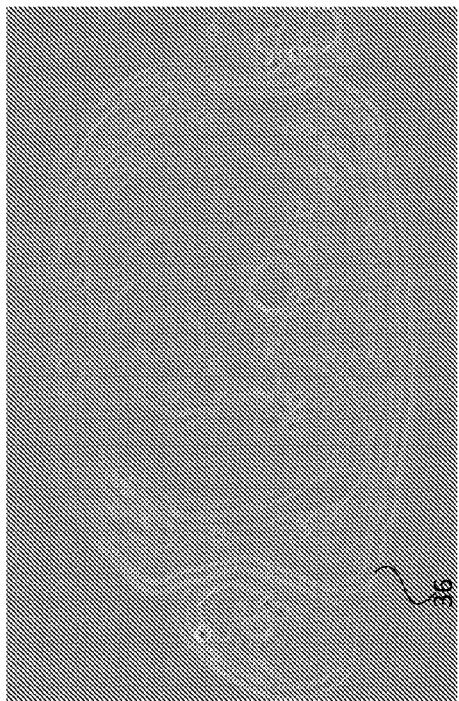
FIG. 34 shows a 2 dimensional Hessian analysis with small eigenvalues.
Figure 33:
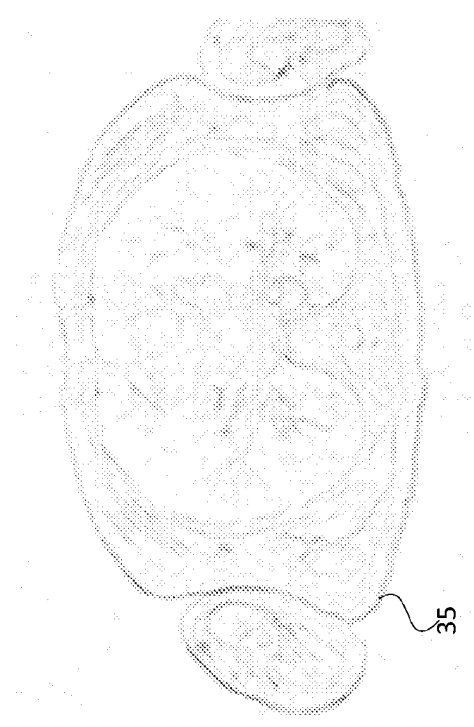
FIG. 33 shows a 2 dimensional Hessian analysis with large eigenvalues.

In one embodiment, truncation detection includes a computed intensity profile of voxels perpendicular to and along the segmented body contour. The computed intensity profile can be compared to an expected profile which includes contrasted skin layers and subcutaneous fat 34 such as from a Dixon MR image reconstruction. In another embodiment, truncation detection includes computed geometric features which characterize a contrasted profile at a boundary of the body contour. For example, the contrasted profile at the boundary is shown in FIG. 33 and FIG. 34 using Hessian computed gradient images. In FIG. 33 and FIG. 34 a map of the eigenvalues of second derivative of the image is constructed from the image of FIG. 31. A layer like structure which can represent the outer skin layer is characterized by large negative value 35 such as in FIG. 33 and one eigenvalue with negligible magnitude 36 such as in FIG. 34. Applying a 3-dimensional Hessian generates one large negative eigenvalue and two eigenvalues with negligible magnitude. In another embodiment, truncation detection includes computed geometric moments which includes characteristics of a region constructed based on local region growing and a threshold intensity stopping criterion.

In a detected truncation, corrections can be applied by the feature unit 12. In one embodiment, truncated regions can be augmented by information from other sources such as other non-attenuation corrected images, atlas information, etc. For example, a non-attenuation corrected nuclear image, e.g. an NAC-PET or TOP NAC-PET image, can provide additional information through segmented regions and/or classified segmented regions. The segmented and/or classified nuclear image narrows the truncation in the example of a metal element, or eliminates the truncation in the field of view in the example of a larger field of view including the body contour. Alternatively, correction to truncation can be applied by interpolation. For example, the artifact boundary defined by the metal element induced opening 16 can be estimated which includes a void space roughly spherical with a slightly blurred boundary as shown in FIG. 2 and FIG. 32. Interpolation can include intensity values based on the values on the boundary or the skin surface position and intensity values in other areas. FIG. 32 shows a dotted line representative of an interpolation of the body contour which extends between the truncated edges of the body contour opening.

Certain structures within the body may not be distinguishable just by gray values like the lung regions from the bowel gas regions, which are shown in FIG. 8, or bone from surrounding tissue, which are exemplarily shown in FIG. 12, because the cortical bone appears with low intensity and the bone marrow appears with high intensity.

In order to overcome the above mentioned problems, the apparatus and method for generating an attenuation correction map can use additional regional features and/or boundary features. In particular, the apparatus and method for generating an attenuation correction map can be adapted to calculate a gradient image of the MR image (FIG. 3) and apply a watershed transform to the gradient image (FIG. 4) that segments the image into smaller regions, in order to overcome the problem of image segmentation under unknown absolute image value, in particular, under unknown absolute pixel intensities. Areas relevant for the particular purpose of attenuation map generation are preferentially identified by heuristics over features of these regions such as average gray value (FIG. 5), boundary features between these regions such as difference in average gray value (FIG. 6), and the relations to neighboring regions. Combination of region features like "average gray value" and "relative error" allows the distinction between different body structures like lung and bowel gas (FIGS. 8 to 10). Moreover, the apparatus and method for generating an attenuation correction map can be adapted to apply the watershed transform directly to the MR image, where in contrast to the usual processing watershed lines are generated along the low intensities rather than the high intensities (FIGS. 11 and 12), in order to overcome the problem of bone area detection. The regions can be further processed as exemplarily described above.

The feature set determined for the image regions can be chosen depending on an MR pulse sequence used for generating the MR image. For example, by calibration for different MR pulse sequences different feature sets can be determined, which lead to an assignment of the correct element classes to different image regions of an MR image, wherein during the calibration procedure the correct element classes are known.

The apparatus and method for generating an attenuation correction map are preferentially adapted to be applicable in PET/MR imaging, in particular for the separation of structures such as soft tissue, lung, bowel gas and bone, in order to assign suitable attenuation values to different image regions.

Although in the above described embodiments predefined rules are applied to the determined features for assigning the element classes to the image region, wherein than the attenuation values are assigned to the element classes, in another embodiment the predefined rules can also directly assign an attenuation value to an image region, without explicitly determining the respective element class.

Although in an above described embodiment a first element class image is generated, in particular, based on an MR image, and a second element class image is provided, which is generated based on a further image being, for example, a NAC PET image or TOF-NAC PET image, wherein the first element class image and second class image are combined for producing a combined element class image and wherein the attenuation values are assigned to the element classes of the combined element class, in another embodiment an attenuation correction map, which has been generated based on a first image, in particular, an MR image, only, can be adapted by combining this attenuation correction map with an attenuation element class map, which is produced based on a second image generated by a second imaging system, wherein the second image is, for example, a NAC PET image or TOF-NAC PET image.

Although in embodiments described above two element class images, which are based on two initial images generated by two imaging systems, or an attenuation correction map, which is produced based on a first image, and an attenuation element class map, which is based on a second image, are combined for finally generating a final attenuation correction map, in another embodiment also more than two images from more than two image sources, can be used for producing corresponding element class images to be combined or attenuation correction maps and attenuation element class maps to be combined for generating a multi-source attenuation correction map. Different image sources can be provided by using different imaging systems, and/or different image generation parameters while generating different images with the same imaging system.

Figure 16:
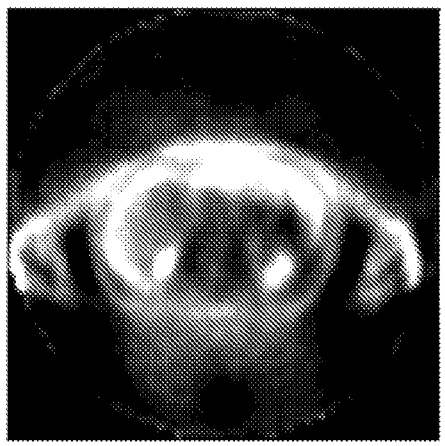
FIG. 16 shows exemplarily a NAC PET image.

Although in the above described embodiments the provided image is preferentially an MR image, in other embodiments the provided image can also be another image like a NAC PET image or a TOF-NAC PET image. For example, the nuclear data acquisition unit 2 can be adapted to acquire PET data and the nuclear image reconstruction unit 14 can be adapted to reconstruct a NAC PET image, i.e. a PET image which has been reconstructed without considering TOF information and without considering attenuation information. Such a NAC PET image is schematically and exemplarily shown in FIG. 16.

Figure 17:
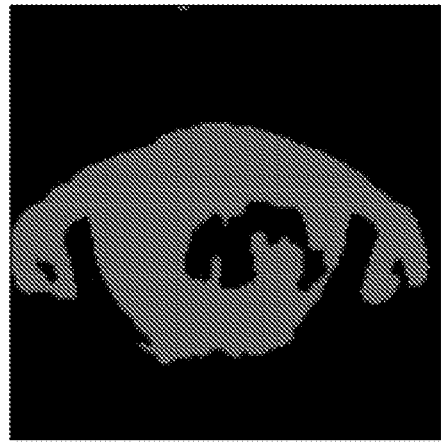
FIG. 17 shows exemplarily the result of a threshold-based image segmentation procedure applied to the NAC PET image shown in FIG. 16.
Figure 18:
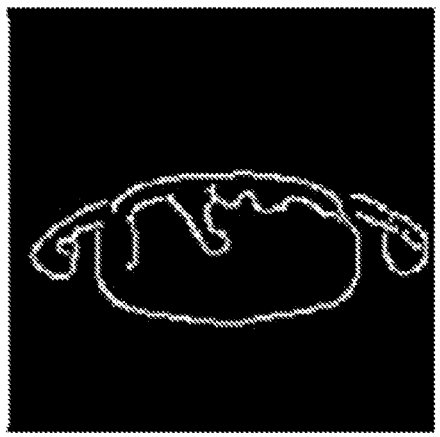
FIG. 18 shows exemplarily a result of applying an edge detection filter to the NAC PET image shown in FIG. 16.

A straight-forward image segmentation approach for segmenting the NAC PET image could be the application of an intensity threshold. A possible resulting image is schematically and exemplarily shown in FIG. 17. However, the application of an intensity threshold often fails, because NAC PET images typically show contours which are similar to a convex hull of the person's geometry, not allowing a differentiation of neighboring structures like body and arms. Moreover, intensities of image values of a NAC PET image have unknown and varying height. Generally, also a "Canny edge" filter that more robustly detects edges could be applied to the NAC PET image. A corresponding resulting image is schematically and exemplarily shown in FIG. 18. The application of a "Canny edge" filter has the disadvantage that detected edges often do not join into closed contours and thus the edge is needed to be somehow extrapolated by additional post-processing, in order to define the enclosed regions.

Figure 19:
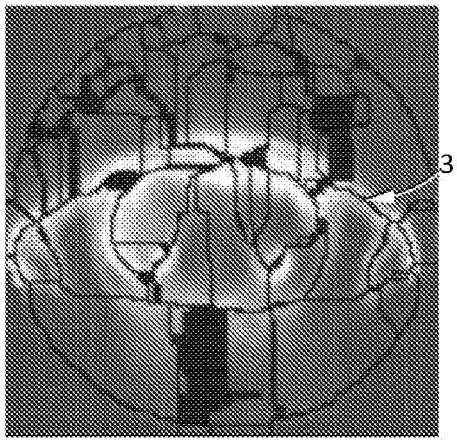
FIG. 19 shows exemplarily watershed lines resulting from a watershed segmentation applied to the image shown in FIG. 16.
Figure 20:
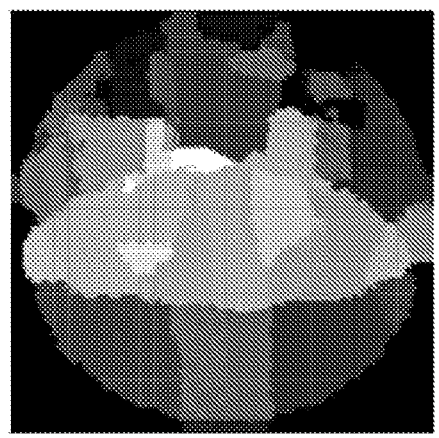
FIG. 20 shows exemplarily an average image value feature image.
Figure 21:
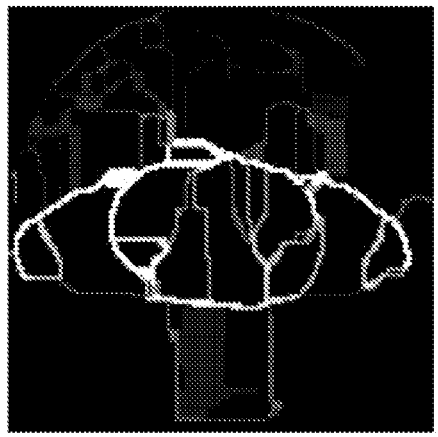
FIG. 21 shows exemplarily a boundary feature image.

The apparatus and method for generating an attenuation correction map can be adapted to overcome the problem of incomplete contours by applying a watershed segmentation, i.e. a watershed transform, to the NAC PET image. Thus, in an embodiment the watershed segmentation unit 11 is adapted to segment the NAC PET image into image regions by applying a watershed transform. A resulting image with watershed lines 36 is schematically and exemplarily shown in FIG. 19. Areas relevant for the particular purpose of attenuation correction map generation can be identified by heuristics over region and/or boundary features, in particular, in relation to neighboring regions. Thus, the image providing unit can be adapted to provide a NAC PET image, wherein the smoothing unit can be adapted to smooth the provided NAC PET image and to optionally perform further pre-processing steps on the NAC PET image. The watershed segmentation unit 11 can then segment the NAC PET image into smaller regions by applying the watershed algorithm. In this embodiment, a gradient image is not generated before applying the watershed algorithm. Then, the feature determination unit can determine region and/or boundary features as described above. For instance, for each image region an average of the image values of the respective image region can be determined resulting in an average image value feature image as schematically and exemplarily shown in FIG. 20, in which regions having different averages are shown with different gray values. FIG. 21 shows exemplarily and schematically a boundary feature image, wherein boundaries having different minimal image values are shown with different gray values.

Figure 22:
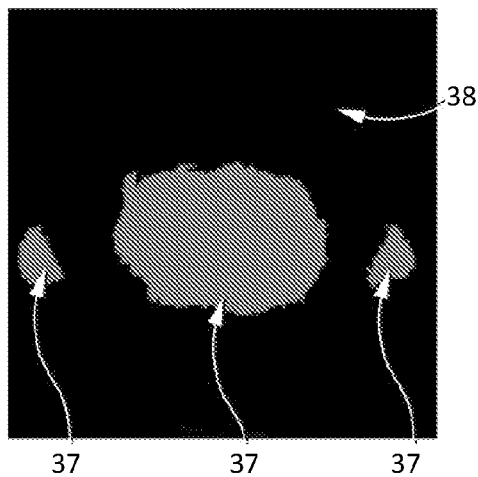
FIG. 22 shows exemplarily a first element class image comprising assignments between element classes and images regions.

The assigning unit can then be adapted to assign attenuation values to the image regions of the NAC PET image based on the determined features for generating the attenuation correction map. For example, the assigning unit can be adapted to apply predefined rules to the determined features for assigning the element classes to the image regions for producing a first element class image. In particular, image regions are labeled such that they are assigned to air or body by reasoning over the determined features. In this embodiment, the predefined rules are determined for features of a NAC PET image, wherein these rules can be determined by calibration measurements, wherein the features are determined based on a NAC PET image and wherein the distribution of the element classes, in particular, of air and body, in the NAC PET image is known and wherein the rules are predefined such that the assignments, which result from the application of the rules to the determined features, meet as good as possible the known assignments of the image regions to the element classes. A resulting first element class image is schematically and exemplarily shown in FIG. 22. In FIG. 22, reference number 37 denotes tissue and reference number 38 denotes air.

The assigning unit can be further be adapted to provide a second element class image of the object, which is produced based on a second image of the object generated by using a second imaging configuration, in particular, a second imaging system, and which is segmented into the element classes. For example, the second element class image can be based on a CT image or an MR image. The first element class image and the second element class image can then be combined for producing a combined element class image, wherein the attenuation values are assigned to the element classes of the combined element class image based on predefined assignments between the element classes and the attenuation values. The resulting attenuation correction map can then be used for a reconstructing an AC PET image of the object.

Figure 23:
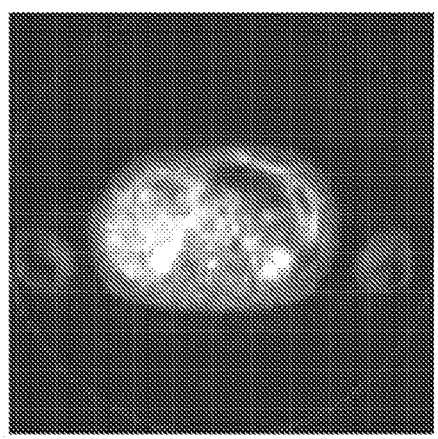
FIG. 23 shows exemplarily a TOF-NAC PET image.

The image provided by the image providing unit can also be a TOF-NAC PET image as schematically and exemplarily shown in FIG. 23. A straight-forward image segmentation applied to the TOF-NAC PET image such as an application of an intensity threshold might fail, because the intensity of TOF-NAC PET images can vary over slices or slices may show stronger scatter that cannot be distinguished from low intensity tissue values. Moreover, TOF-NAC PET images do not show known absolute intensity values like CT images. An intensity threshold would therefore be needed to be determined individually for each TOF-NAC PET image.

Figure 24:
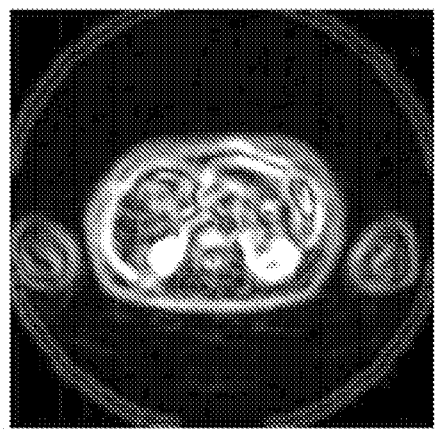
FIG. 24 shows exemplarily a gradient image of the TOF-NAC PET image shown in FIG. 23.
Figure 25:
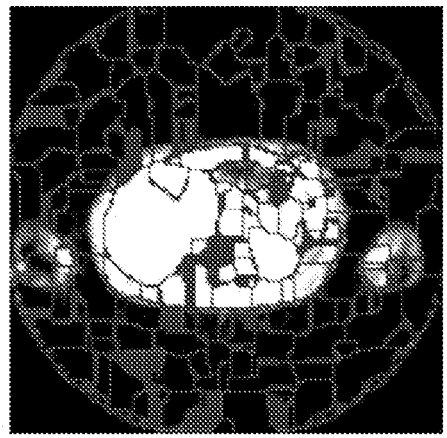
FIG. 25 shows exemplarily a result of a watershed segmentation applied to the gradient image shown in FIG. 24.

The apparatus and method for generating an attenuation correction map can be adapted to overcome the problem of image segmentation under varying or unknown pixel intensities by calculating a gradient image of the TOF-NAC PET image (FIG. 24) and applying a watershed transform to the gradient image (FIG. 25). Areas relevant for the particular purpose of attenuation map generation can be identified by using predefined rules, i.e. by heuristics over region and/or boundary features and, in particular, relations to neighboring regions. The apparatus and method can be adapted to distinguish between different body structures like the lung and other tissue as described below with reference to FIG. 30.

Thus, the nuclear data acquisition unit can acquire PET data and the nuclear image reconstruction unit can be adapted to reconstruct a TOF-NAC PET image from the acquired PET data, without considering TOF information and without considering attenuation information, in order to provide an image of the object. The nuclear data acquisition unit and the nuclear image reconstruction unit can therefore be regarded as being an image providing unit for providing an image of the object. FIG. 23 shows schematically and exemplarily a provided TOF-NAC PET image. The smoothing unit can smooth the provided TOF-NAC PET image and optionally perform a further pre-processing of the TOF-NAC PET image like a truncation of image values to a certain value range or an enhancement of edge structures in the image. The TOF-NAC PET image can be differentiated by the differentiation unit for generating a gradient image, which is schematically and exemplarily shown in FIG. 24.

Figure 26:
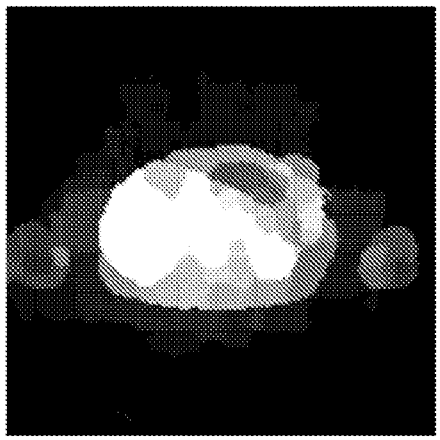
FIG. 26 shows exemplarily an average image value feature image.
Figure 27:
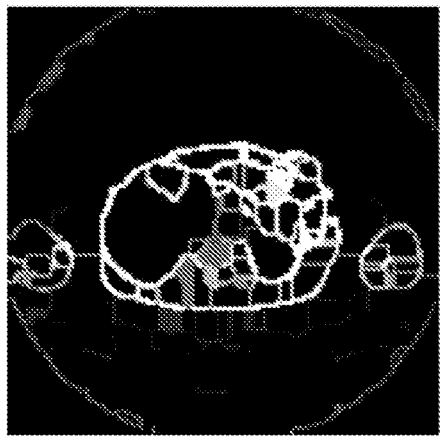
FIG. 27 shows exemplarily a boundary feature image.
Figure 28:
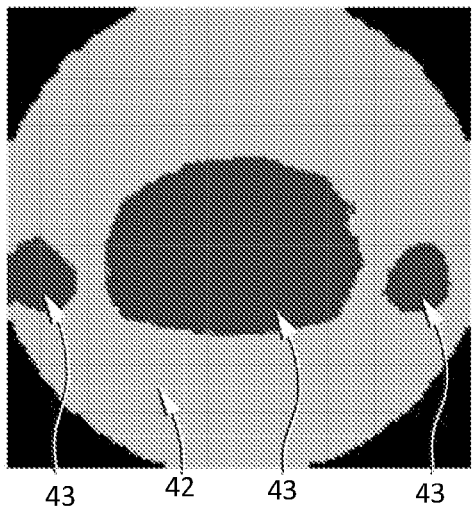
FIG. 28 shows exemplarily a first element class image defining preliminary assignments between image regions and element classes.

In this embodiment, the watershed segmentation unit applies watershed segmentation to the gradient image for segmenting the gradient image into smaller regions, in particular, into image regions corresponding to the element classes. The feature determination unit determines features of at least one of a) the image regions and b) boundaries between the image regions depending on image values of the image. For example, for each image region an average image value is calculated as schematically and exemplarily shown in FIG. 26, in which different average image values are shown with different gray values. FIG. 27 shows schematically and exemplarily different boundary features, wherein different boundary features are shown with different gray values. The boundary features shown in FIG. 27 are minimal image values within a respective boundary between neighboring image regions. The assigning unit can be adapted to assign attenuation values to the image regions based on the determined features for generating an attenuation correction map based on a TOF-NAC PET image. For example, predefined rules can be applied to the determined features for assigning the element classes to the image regions for producing a first element class image. In an embodiment, the first element class image, which may also be regarded as being a first label image, shows air and tissue as element classes as schematically and exemplarily shown in FIG. 28. In FIG. 28, the image regions indicated by reference number 42 have been assigned to the element class "air" and the image regions denoted by reference number 43 have been assigned to the element class "tissue". Thus, image regions can be assigned to, for example, air or tissue or particular anatomical structures like the lungs by reasoning over the determined features.

The assigning unit can further be adapted to provide a second element class image of the object, which is produced based on a second image of the object generated by using a second imaging configuration and which is segmented into the element classes. For instance, the second element class image can be a label image generated based on an image provided by another imaging configuration, in particular, generated by another imaging modality like a CT or an MR imaging modality, or generated by the same imaging modality, i.e., in this embodiment, also by a PET system, but with other acquisition parameters and/or reconstruction parameters. The assigning unit can further be adapted to combine the first element class image and the second element class image for producing a combined element class image and to assign attenuation values to the element classes of the combined element class image based on predefined assignments between the element classes and the attenuation values, in order to produce a multi-source attenuation correction map, which is based on a TOF-NAC PET image and a further image provided by using another imaging configuration.

Figure 29:
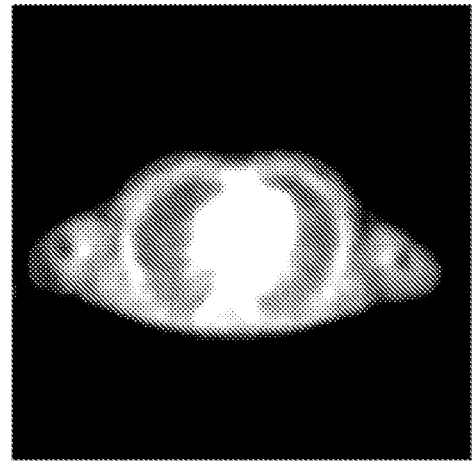
FIG. 29 shows exemplarily a TOF-NAC PET image showing lungs.
Figure 30:
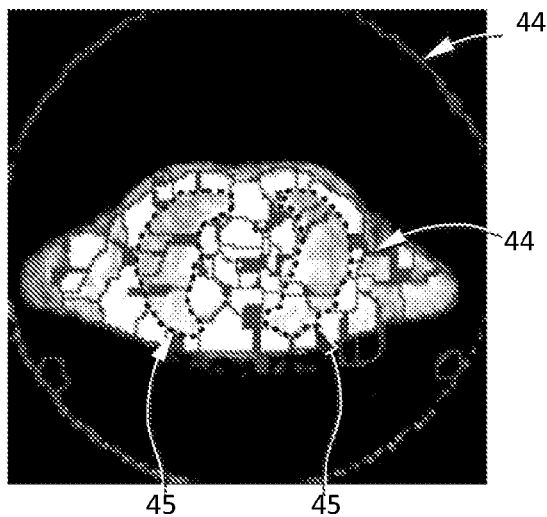
FIG. 30 shows exemplarily watershed lines and segmented lungs.

FIG. 29 shows schematically and exemplarily a TOF-NAC PET image showing the lungs. Also the TOF-NAC PET image shown in FIG. 29 can be provided by the nuclear data acquisition unit 2 and the nuclear image reconstruction unit 14 and can be used for generating a first element class image. In particular, the TOF-NAC PET image shown in FIG. 29 can be smoothed by the smoothing unit, differentiated by the differentiation unit for generating a gradient image and segmented by the watershed segmentation unit for generating a segmented image comprising image regions corresponding to the element classes. The feature determination unit determines then features of the image regions and/or of the boundaries between the image regions depending on image values of the TOF-NAC PET image as described above. The assigning unit applies predefined rules to the determined features for assigning the element classes to the image regions for producing a first element class image, wherein the produced first element class image can be combined with a provided second element class image for producing a combined element class image, to which attenuation values can be assigned for producing an attenuation correction map. FIG. 30 shows schematically and exemplarily watershed lines 44 resulting from the watershed segmentation and lines 45 enclosing the lung of the person 7, i.e. to the image regions enclosed by the lines 45 the element class "lung" has been assigned.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

Calculations like the smoothing operation, the differentiation, the watershed segmentation, the feature determination, et cetera performed by one or several units or devices can be performed by any other number of units or devices. For example, steps 102 to 107 can be performed by a single unit or by any other number of different units. The calculation and assigning procedures and/or the control of the apparatus for generating an attenuation correction map in accordance with the method for generating an attenuation correction and/or the control of the nuclear imaging system in accordance with the nuclear imaging method can be implemented as program code means of a computer program and/or as dedicated hardware. The units or devices are suitably embodied by an electronic data processing device such as an electronic processor, a processor of a computer or a server.

A computer program may be stored/distributed on a suitable non-transient computer readable storage medium, such as an optical storage medium or a solid-state medium, supplied together with or as part of other hardware, but may also be distributed in other forms, such as via the Internet or other wired or wireless telecommunication systems.

Any reference signs in the claims should not be construed as limiting the scope.

The invention relates to an apparatus for generating an attenuation correction map. An image providing unit provides an image of an object comprising different element classes and a watershed segmentation unit applies a watershed segmentation to the image for generating a segmented image comprising image regions corresponding to the element classes. A feature determination unit determines features of at least one of a) the image regions and b) boundaries between the image regions depending on image values of the image and an assigning unit assigns attenuation values to the image regions based on the determined features for generating the attenuation correction map. The performed image processing steps can allow for producing a high quality attenuation correction map, even if the initial image does not comprise image values related to the attenuation of radiation like a CT image.

The invention claimed is:

1. A nuclear imaging system for generating a nuclear image of an object, the nuclear imaging system comprising:
   a nuclear imaging system configured to generate nuclear data;
   one or more computer processors configured to generate an attenuation correction map for use in reconstructing the nuclear data into an attenuation-corrected nuclear image of an object, the one or more computer processors being configured to:
      reconstruct the nuclear data into a non-attenuation corrected image,
      apply a watershed segmentation to the non-attenuation corrected image to generate a segmented image including image regions, each corresponding to an element class,
      determine features of at least one of a) the image regions and b) boundaries between the image regions depending on image values of the non-attenuation corrected image, and
      assign attenuation values to the image regions based on the determined features to generate the attenuation correction map;
   a nuclear image reconstruction processor configured to reconstruct the nuclear data into an attenuation corrected nuclear image using the attenuation correction map.

2. The apparatus as defined in claim 1, wherein the one or more processors are further configured to:
   differentiate the non-attenuation corrected image to generate a gradient image before applying the watershed segmentation.

3. The apparatus as defined in claim 1, wherein the one or more computer processors are configured to:
   generate watershed lines using a watershed algorithm along low image values of the non-attenuation corrected image for generating the segmented image.

4. The apparatus as defined in claim 1, wherein the nuclear data is positron emission tomography (PET) nuclear data such that the attenuation corrected nuclear image is a PET image.

5. The apparatus as defined in claim 4, wherein the PET nuclear data is time-of-flight PET nuclear data.

6. An apparatus for generating an attenuation correction map used for reconstructing an attenuation-corrected nuclear image of an object, the apparatus comprising:
   a first image providing unit adapted to provide a first image of the object, the first image having been generated by using a first imaging configuration;
   a segmentation unit configured to apply a watershed segmentation to the first image for generating a segmented first image comprising image regions corresponding to element classes;
   a feature determination unit configured to determine features of at least one of a) the image regions and b) boundaries between the image regions depending on image values of the first image;
   an assigning unit for assigning attenuation values to the image regions based on the determined features for generating the attenuation correction map, wherein the assigning unit is further configured to:
      provide an attenuation element class map, which is produced based on a second image generated by using a second imaging configuration and which comprises attenuation values corresponding to the respective element classes at the positions of the respective element classes within the map; and
      adapt the attenuation correction map by combining the attenuation correction map with the attenuation element class map.

7. An apparatus for generating an attenuation correction map used for reconstructing an attenuation-corrected nuclear image of an object, the apparatus comprising:
   one or more computer processors configured to:
      receive at least one magnetic resonance (MR) image which depicts at least a skin layer and a subcutaneous fat layer adjacent the skin layer, the MR image contrasting the skin layer and the subcutaneous fat layer,
      segment the MR image into image regions corresponding to at least the skin layer, the subcutaneous fat layer, and
      determine features of a) the image regions and b) boundaries between the image regions and boundaries of the object depending on image values of the image,
      determine whether each determined boundary represents a body contour of the object based on a presence of the adjacent skin and subcutaneous fat layers, or represents a truncation in the body contour based on an absence of the adjacent skin and subcutaneous fat layers,
      assign attenuation values to the image regions based on the determined features to generate the attenuation correction map.

8. The apparatus as defined in claim 7, wherein the one or more computer processors are configured to determine truncation in the outer body contour by at least one of:
   computing intensity profiles of voxels perpendicular to and along the segmented body contour compared to an expected contrasted skin layers and subcutaneous fat;
   computing geometric features which characterize a contrasted profile at a boundary of the segmented body contour; and
   computing geometric moments which characterize the segmented body contour based on a local region growing with a threshold stopping criterion.

9. The apparatus as defined in claim 7, wherein the one or more computer processors are configured to correct for detected truncation based on at least one of:
   measurements of a corresponding region from a non-attenuation corrected nuclear image; and
   interpolation between edges of the segmented body contour.

10. A method for generating an attenuation correction map used for reconstructing an attenuation-corrected nuclear image of an object comprising different element classes, the method comprising with one or more computer processors:
    applying a watershed segmentation to a first image from a first imaging device to generate a segmented first image comprising image regions corresponding to element classes;
    determining features of the image regions and boundaries between the image regions depending on image values of the first image;
    generating an attenuation map based on a second image of the object generated by a second imaging apparatus; and
    combining the segmented first image and the second image attenuation map to assign attenuation values to the image regions to generate the attenuation correction map.

11. The method as defined in claim 10, wherein the second image includes a magnetic resonance image of the object.

12. A method for generating an attenuation correction map for use in reconstructing attenuation corrected nuclear images of a subject comprising:
    segmenting a magnetic resonance image of the subject which depicts adjacent contrasting skin and subcutaneous fat layers to generate image regions and boundaries between image regions and along a surface contour;
    determining features of the image regions;
    determining boundaries which represent the body contour of the subject by a presence of contrasting adjacent skin and subcutaneous fat layers adjacent the boundary;
    determining boundaries which represent truncation by an absence of contrasting adjacent skin and subcutaneous fat layers adjacent the boundary;
    based on the features, determining an attenuation value for each of the image regions;
    from the attenuation values, the determined surface contour, and the determined non-surface contour boundaries, generating the attenuation correction map.

13. The method as defined in claim 12, further including:
    reconstructing an attenuation corrected nuclear image using the attenuation map including interpolating to correct discontinuities in the surface contour attributable to artifacts.

14. The method as defined in claim 12, wherein determining features includes at least one of:
    computing intensity profiles of voxels perpendicular to and along the segmented body contour compared to an expected contrasted skin layers and subcutaneous fat;
    computing geometric features which characterize a contrasted profile at a boundary of the segmented body contour; and
    computing geometric moments which characterize the segmented body contour based on a local region growing with a threshold stopping criterion.

15. An apparatus for generating an attenuation correction map for use in reconstructing an attenuation corrected nuclear image of a subject, the apparatus comprising one or more computer processors configured to:
- receive a non-attenuation corrected PET image of the object generated by a first image source;
- segment the non-attenuation corrected PET image into regions defined by boundaries using a watershed algorithm to generate a segmented non-attenuation corrected PET image;
- determine features of the regions and the boundaries;
- classify the regions in one of a plurality of classes based on the determined features to generate a region classified non-attenuation corrected PET image, the classes including at least tissue and air;
- receive a second image of the object generated by a second image source, the second image being labeled with attenuation values, wherein the second image is one of a computed tomography image, a magnetic resonance image, and a non-attenuation corrected time-of-flight PET image;
- combine the region classified a non-attenuation corrected PET image and the second image to generate a combined image;
- provide an attenuation element class map, which is produced based on a second image generated by using a second imaging configuration and which comprises attenuation values corresponding to the respective element classes at the positions of the respective element classes within the map; and
- adapt the attenuation correction map by combining the attenuation correction map with the attenuation element class map.

16. The apparatus as defined in claim 15, wherein the non-attenuation corrected PET image is a non-attenuation corrected time-of-flight PET image.

* * * * *